(12) United States Patent
Shin et al.

(10) Patent No.: US 12,308,327 B2
(45) Date of Patent: *May 20, 2025

(54) SEMICONDUCTOR DEVICE WITH COMPARTMENT SHIELD FORMED FROM METAL BARS AND MANUFACTURING METHOD THEREOF

(71) Applicant: STATS ChipPAC Pte. Ltd., Singapore (SG)

(72) Inventors: YongKook Shin, Gyoenggi-do (KR); KyoWang Koo, Incheon (KR); HeeYoun Kim, Incheon (KR); SeongKuk Kim, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/635,819

(22) Filed: Apr. 15, 2024

(65) Prior Publication Data
US 2024/0258246 A1    Aug. 1, 2024

Related U.S. Application Data

(63) Continuation of application No. 17/648,365, filed on Jan. 19, 2022, now Pat. No. 11,990,421.

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4871* (2013.01); *H01L 21/50* (2013.01); *H01L 23/3121* (2013.01)

(58) Field of Classification Search
CPC ... H01L 23/552; H01L 21/4871; H01L 21/50; H01L 23/3121; H01L 21/6835;
(Continued)

(56) References Cited

U.S. PATENT DOCUMENTS 9,070,793 B2    6/2015  Liao et al.
10,418,332 B2   9/2019  Lee et al.
(Continued)

FOREIGN PATENT DOCUMENTS

CN    103165563 A    6/2013
CN    105097784 A    11/2015
(Continued)

*Primary Examiner* — Didarul A Mazumder
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and first and second electrical component disposed over the substrate. A first metal bar is disposed over the substrate between the first electrical component and second electrical component. The first metal bar is formed by disposing a mask over a carrier. An opening is formed in the mask and a metal layer is sputtered over the mask. The mask is removed to leave the metal layer within the opening as the first metal bar. The first metal bar can be stored in a tape-and-reel.

22 Claims, 16 Drawing Sheets

(51) Int. Cl.
*H01L 21/50* (2006.01)
*H01L 21/52* (2006.01)
*H01L 23/31* (2006.01)

(58) Field of Classification Search
CPC ....... H01L 21/561; H01L 21/78; H01L 21/52; G01S 17/48
USPC .................. 257/659, 347; 438/149, 479, 517
See application file for complete search history.

(56) References Cited

U.S. PATENT DOCUMENTS

| | | | |
|---|---|---|---|
| 10,937,739 | B2 | 3/2021 | Jun |
| 11,990,421 | B2* | 5/2024 | Shin ........................ H01L 21/50 |
| 2004/0102037 | A1 | 5/2004 | Tanida et al. |
| 2006/0170086 | A1 | 8/2006 | Song et al. |
| 2012/0025356 | A1* | 2/2012 | Liao ........................ H01L 24/97 |
| | | | 257/659 |
| 2015/0333017 | A1* | 11/2015 | Chang ................ H01L 23/3121 |
| | | | 257/659 |
| 2018/0130755 | A1* | 5/2018 | Lee ..................... H01L 25/0655 |
| 2018/0158768 | A1 | 6/2018 | Kim et al. |
| 2018/0240759 | A1 | 8/2018 | Haji-Rahim et al. |
| 2018/0374798 | A1* | 12/2018 | Lee ....................... H01L 23/552 |
| 2020/0194379 | A1* | 6/2020 | Kim ........................ H01L 24/09 |
| 2022/0051936 | A1 | 2/2022 | Chuang |

FOREIGN PATENT DOCUMENTS

| | | |
|---|---|---|
| CN | 111816640 A | 10/2020 |
| KR | 20180045606 A | 5/2018 |
| KR | 20180065937 A | 6/2018 |
| WO | 0241679 A2 | 5/2002 |

\* cited by examiner

SEMICONDUCTOR DEVICE WITH COMPARTMENT SHIELD FORMED FROM METAL BARS AND MANUFACTURING METHOD THEREOF

CLAIM OF DOMESTIC PRIORITY

The present application is a continuation of U.S. patent application Ser. No. 17/648,365, now U.S. Pat. No. 11,990,421, filed Jan. 19, 2022, which application is incorporated herein by reference.

FIELD OF THE INVENTION

The present invention relates in general to semiconductor devices and, more particularly, to a semiconductor device with a compartment shield formed from metal bars and manufacturing methods thereof.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. The bump material can be reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, conductive pillars, or other electrical interconnect.

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference. Shielding layers are commonly formed to shield electronic parts within the package from EMI and other interference.

Interference can also be intra-device. Semiconductor packages will commonly have compartment shielding to shield one or more components from other components within the package. FIG. 2a shows an example of a lid or can 120 that might be formed to compartmentalize a package. Can 120 has four connected sides to extend completely and continuously around the four-sided semiconductor die 104.

FIG. 2b shows can 120 being added to package 124 as part of the manufacturing process. Can 120 sits on substrate 126 and surrounds semiconductor die 104a. Semiconductor die 104a is protected from EMI generated by semiconductor die 104b, and vice versa, by the conductive material of can 120. Can 120 may be coupled to ground through substrate 126 to improve shielding. An encapsulant 130 is deposited over package 124 in FIGS. 2c and 2d to complete the package. FIG. 2c shows a cross-sectional view while FIG. 2d shows a top-down plan view.

Can 120 works well for shielding but also presents significant problems. Can 120 is mounted as part of the surface mounting process but requires an extra machine to mount the can in addition to the machine used to mount other components. The additional machine decreases productivity and increases costs. Moreover, a different can 120 must be designed and manufactured for every different situation where a can is desired, e.g., different sized die or different components in general. Therefore, a need exists for an improved compartment shielding manufacturing process and device.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
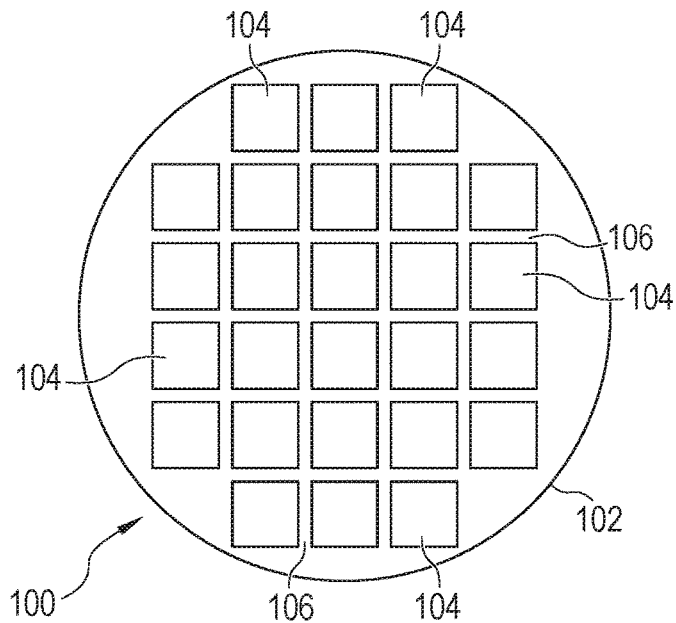
FIGS. 1a-1c illustrate a semiconductor wafer with a plurality of semiconductor die separated by a saw street.
Figure 1B:
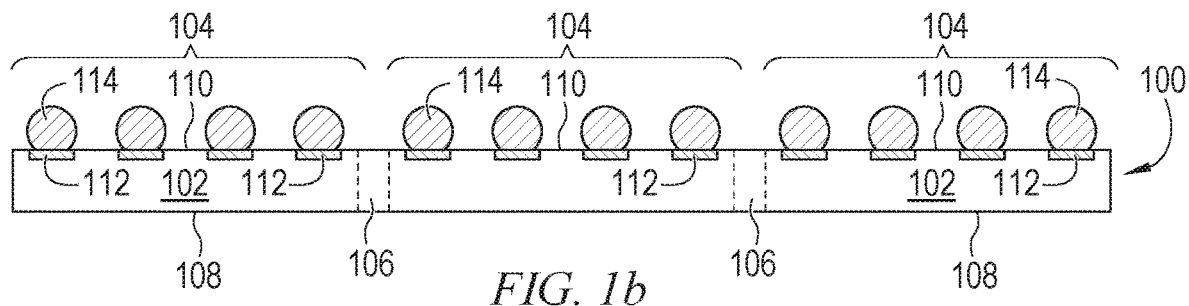
Figure 1C:
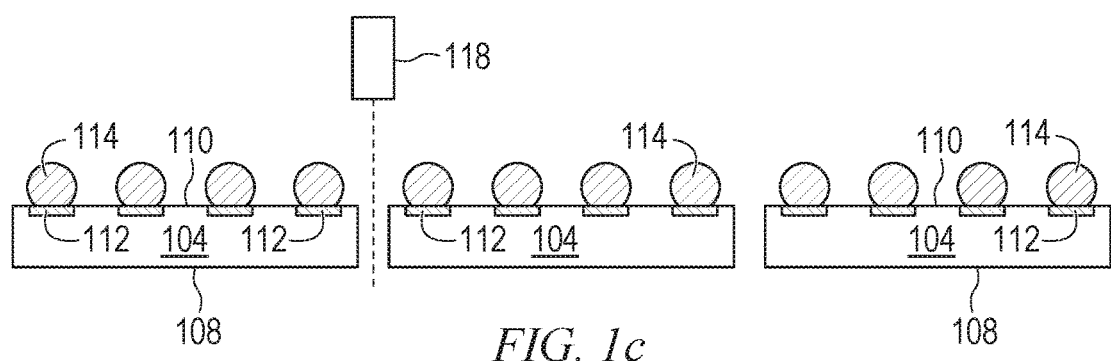
Figure 2A:
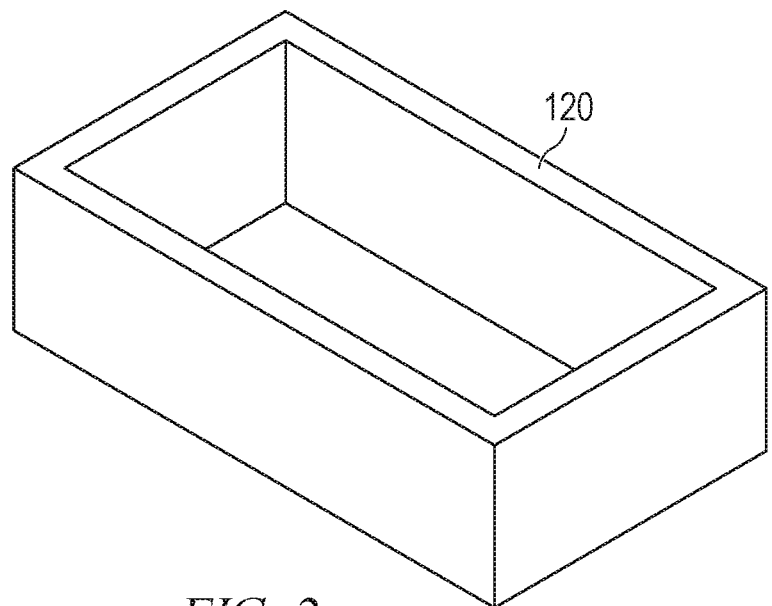
FIGS. 2a-2d illustrate using a shielding can for compartment shielding.
Figure 2B:
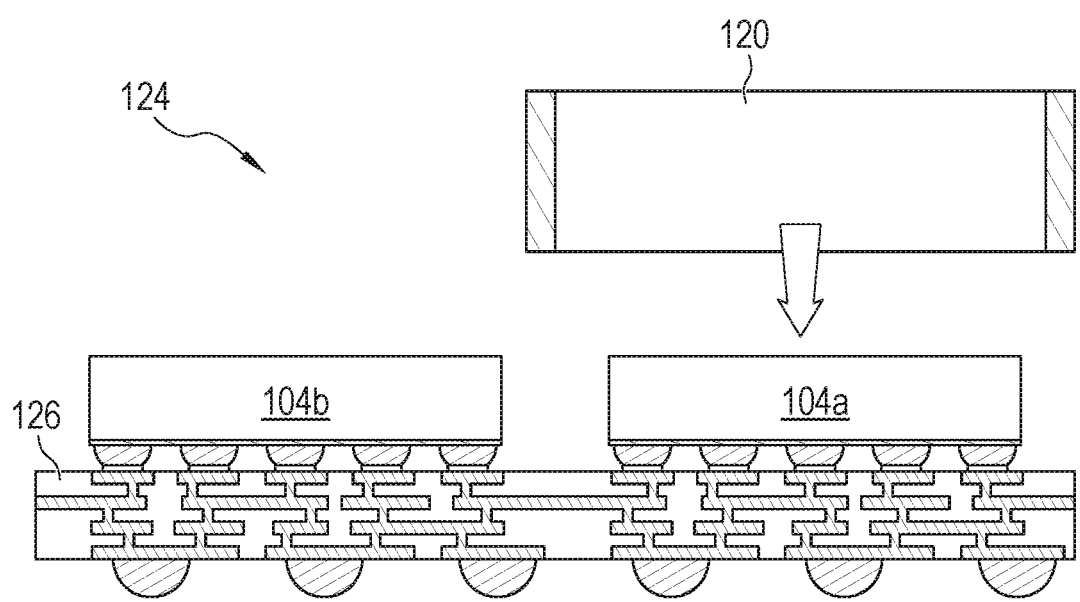
Figure 2C:
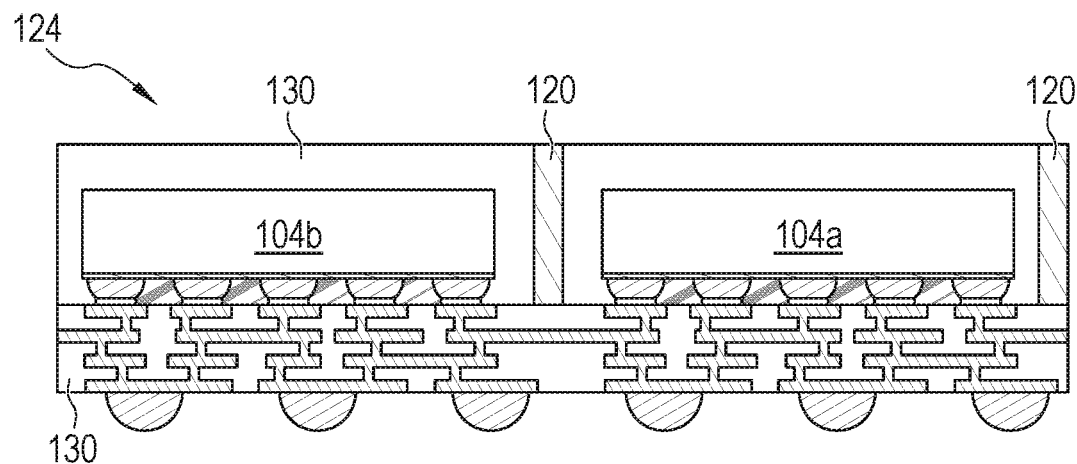
Figure 2D:
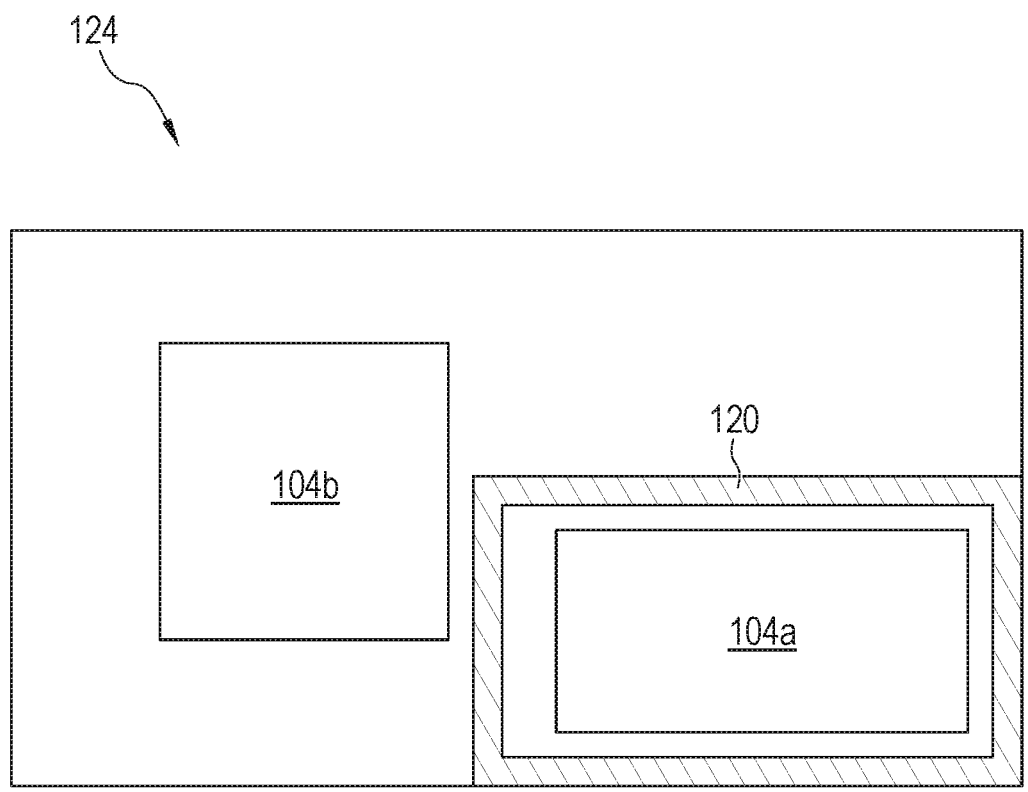
Figure 3A:
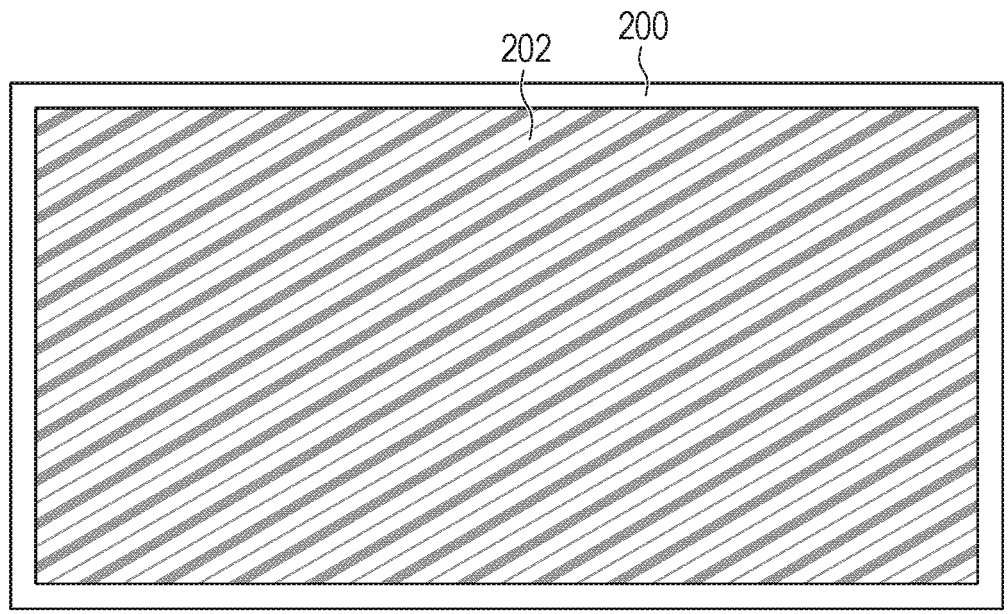
FIGS. 3a-3h illustrate forming metal bars for shielding use.
Figure 3B:
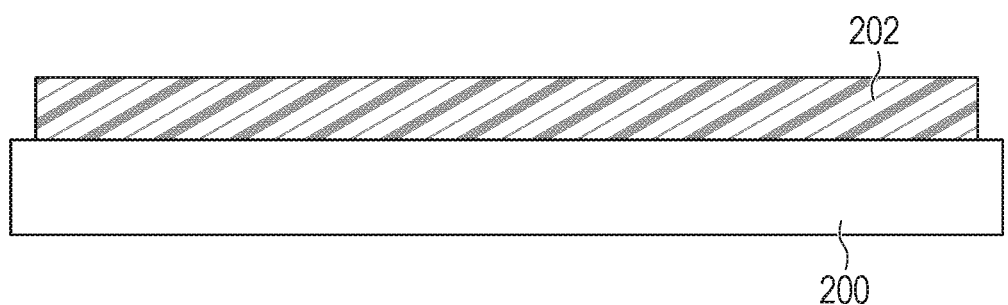

Rather than using pre-formed cans for compartment shielding as in the prior art, the below disclosure teaches forming compartment shielding out of individual metal bars placed using normal surface mount technology (SMT) processes. FIGS. 3a-3h illustrate a process of forming metal bars to use in compartment shielding. Formation of the metal bars starts in FIGS. 3a and 3b with a base film, substrate, or carrier 200 and a mask layer 202 formed over the carrier. FIG. 3a shows a top-down view and FIG. 3b shows a cross-sectional view of the same process step. Mask 202 can be an adhesive tape disposed over carrier 200 or an insulating or photoresist layer sprayed or otherwise coated onto carrier 200 as a liquid and then cured.

Figure 3C:
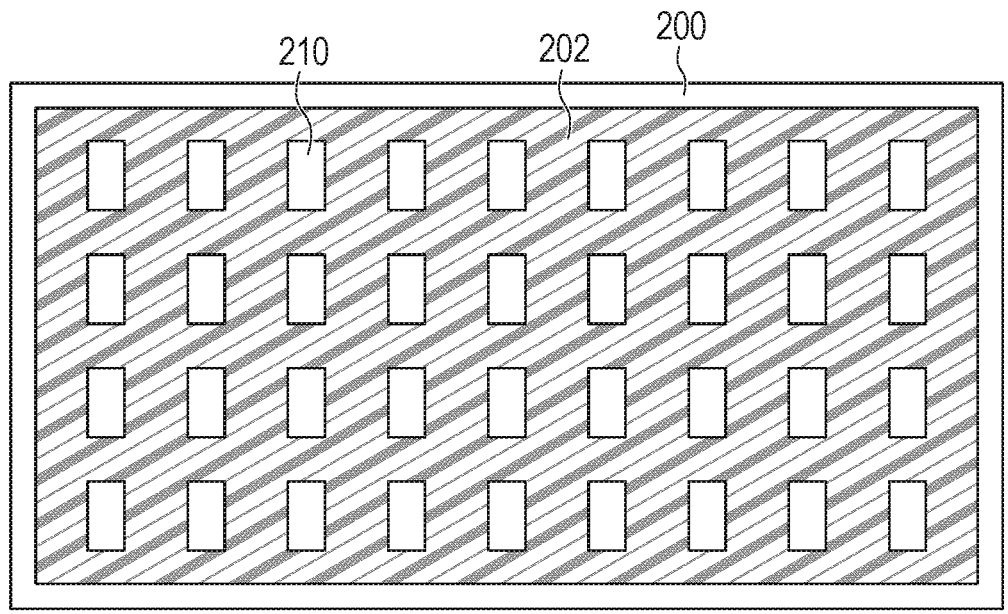
Figure 3D:
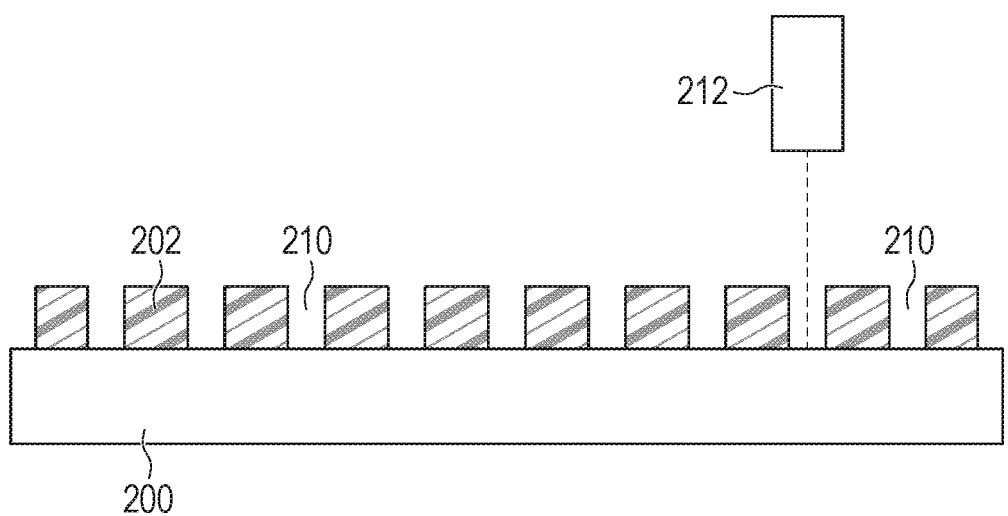

In FIGS. 3c and 3d, openings 210 are formed in mask 202. FIG. 3c shows a top-down view and FIG. 3d shows a cross-sectional view of the same process step. Openings 210 will define the size and shape of the metal bars being formed. Openings 210 can have any suitable length and width as desired for the metal bars being formed. The footprint of openings 210 defines a length and width of the metal bars, while a thickness of mask 202 defines a height of the metal bars if the openings are completely filled with metal. Openings 210 are formed using a laser cutting tool 212 to burn away portions of mask 202 where openings are desired. Openings 210 are formed using a photolithography process in other embodiments. Openings 210 extend completely through mask 202 to expose carrier 200 under the mask. Any number and size of openings 210 can be formed depending on the size of carrier 200 and the capability of the equipment being used.

Figure 3E:
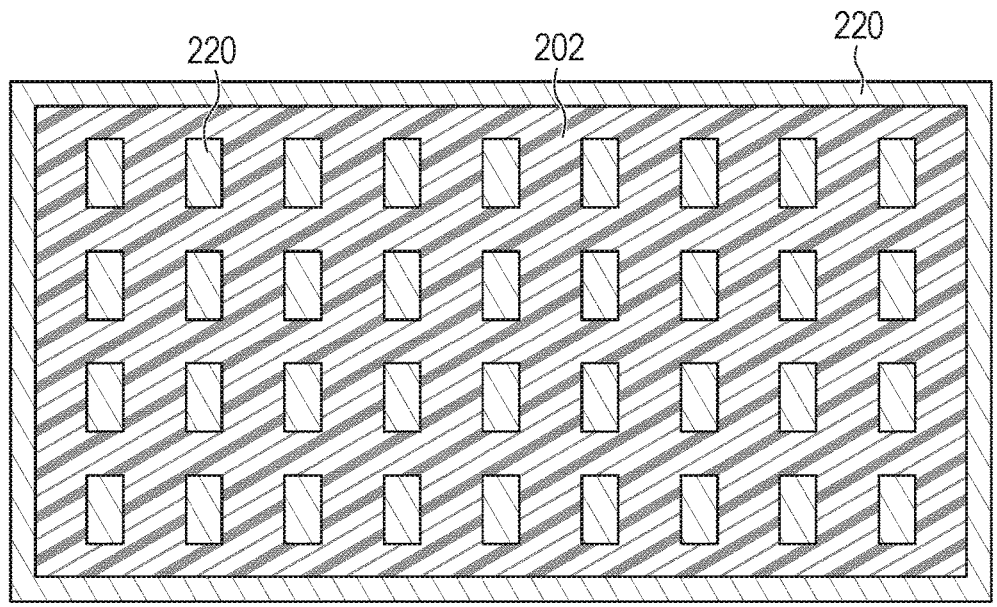
Figure 3F:
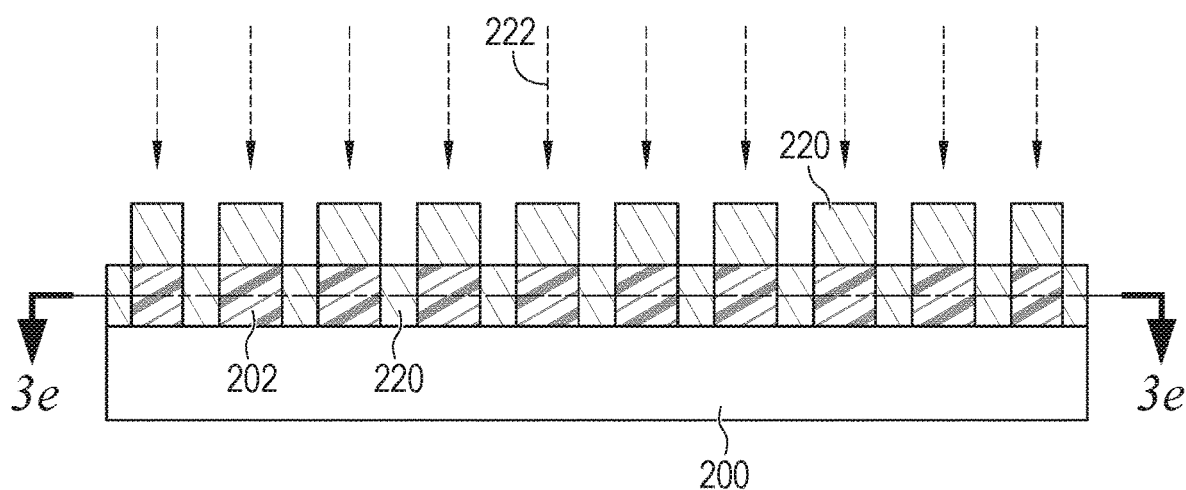

In FIGS. 3e and 3f, a conductive layer 220 is formed over carrier 200 and mask 202, including extending into and completely filing openings 210. FIG. 3e shows a top-down cross-sectional view and FIG. 3f shows a cross-sectional view from the side of the same process step. Conductive layer 220 is formed using any suitable metal deposition technique, e.g., chemical vapor deposition, physical vapor deposition, other sputtering methods, spraying, or plating. Arrows 222 indicate sputtering of metal occurring from the top-down onto carrier 200 and mask 202. The sputtered material can be copper, steel, aluminum, gold, titanium, combinations thereof, or any other suitable conductive material. In some embodiments, conductive layer 220 can be made by sputtering on multiple layers of differing material, e.g., stainless steel-copper-stainless steel or titanium-copper.

Figure 3G:
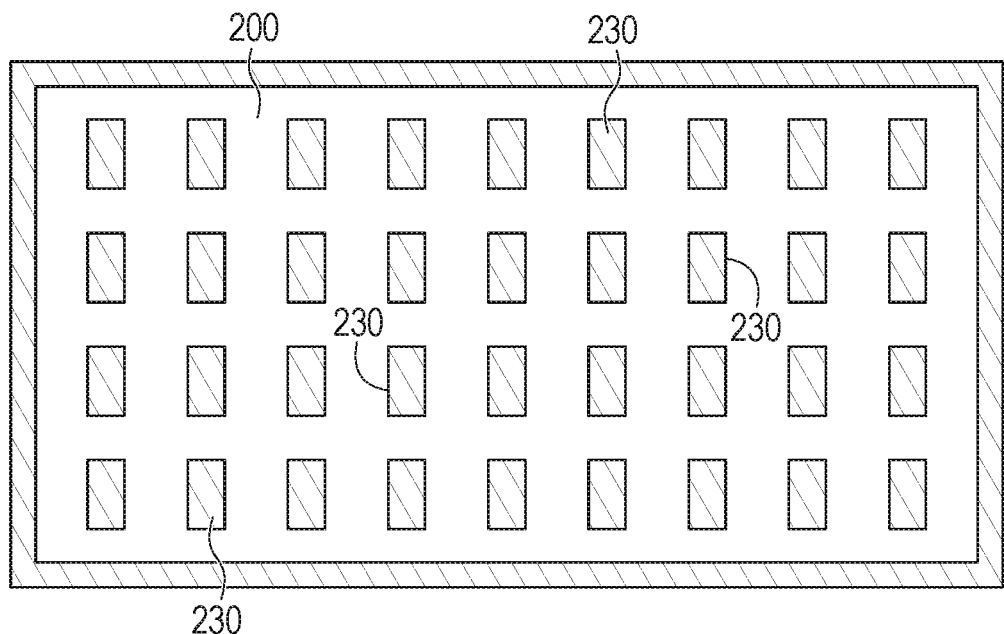
Figure 3H:
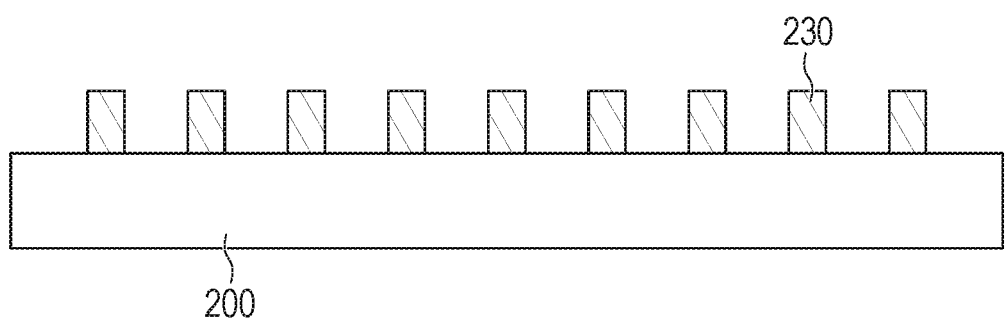

In FIGS. 3g and 3h, mask 202 is removed along with the portions of conductive layer 220 formed on the mask. FIG. 3g shows a top-down view and FIG. 3h shows a cross-sectional view of the same process step. Mask 202 is removed by a chemical solvent dissolving the mask. In other embodiments, mask 202 is removed by peeling or other suitable means. Removing mask 202 leaves metal bars 230 on carrier 200 in substantially the same size and shape as openings 210 were formed. In some embodiments, conductive layer 220 is sputtered with a substantially flat top surface so that the remaining bars 230 have a substantially uniform thickness with the desired height. In other embodiments, conductive layer 220 is backgrinded before or after mask 202 is removed to create bars 230 with a uniform thickness. Metal bars 230 do not necessarily need to have all flat surfaces. Forming metal bars 230 by sputtering allows a smaller bar to be formed compared to conventional metal deposition techniques, which have a minimum wall thickness of around 200 μm. Sputtering allows bars 230 to be formed with a thickness of 80 μm or less.

Figure 4A:
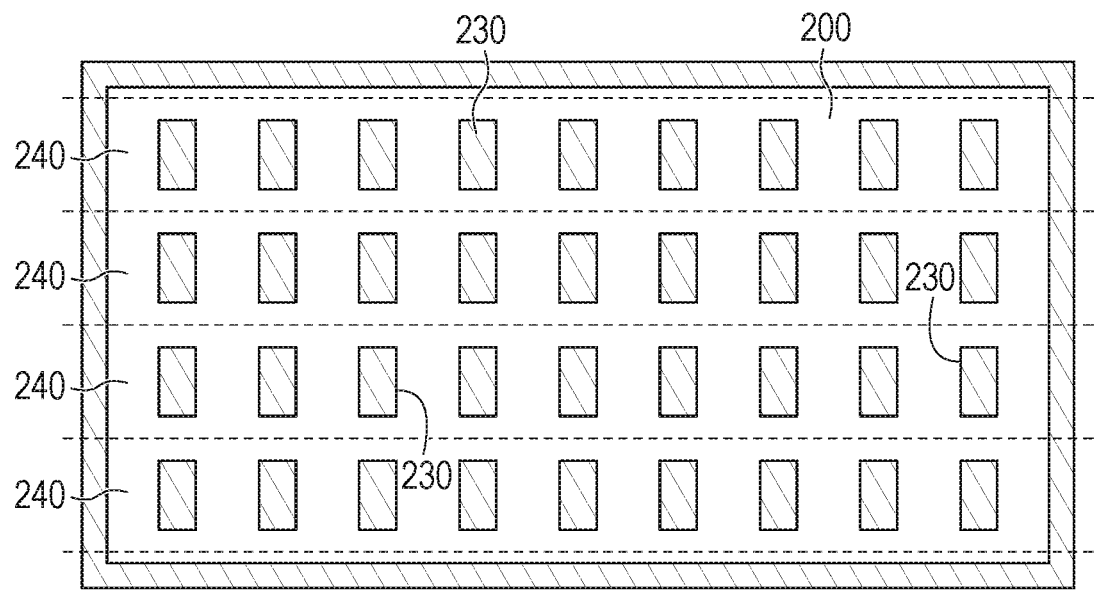
FIGS. 4a-4d illustrate packing the metal bars into a tape and reel.
Figure 4B:
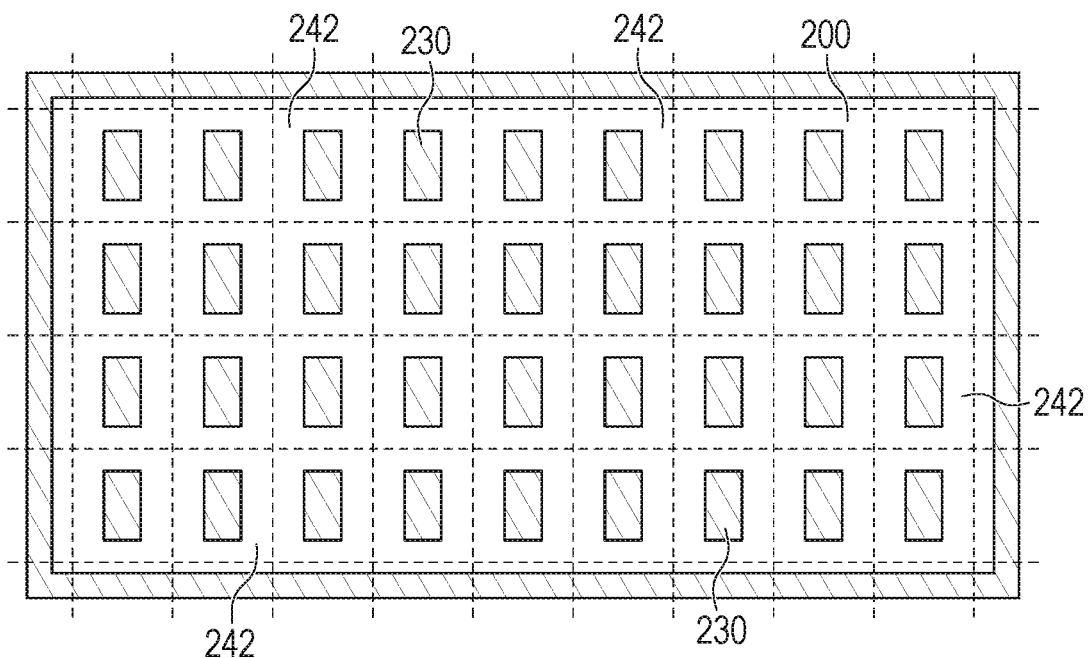

FIGS. 4a-4d illustrate packing metal bars 230 into a tape and reel. FIGS. 4a and 4b illustrate an optional initial step of separating bars 230 to make the pick-and-place operation easier. In FIG. 4a, carrier 200 with bars 230 is cut into a plurality of strips 240. In FIG. 4b carrier 200 is optionally further cut into individual units 242. Carrier 200 is cut using a saw blade, laser, or other appropriate cutting tool. The strips 240 or units 242 are spread apart from each other using an expansion table or other suitable means to make bars 230 easier to grab for the pick-and-place equipment.

Figure 4C:
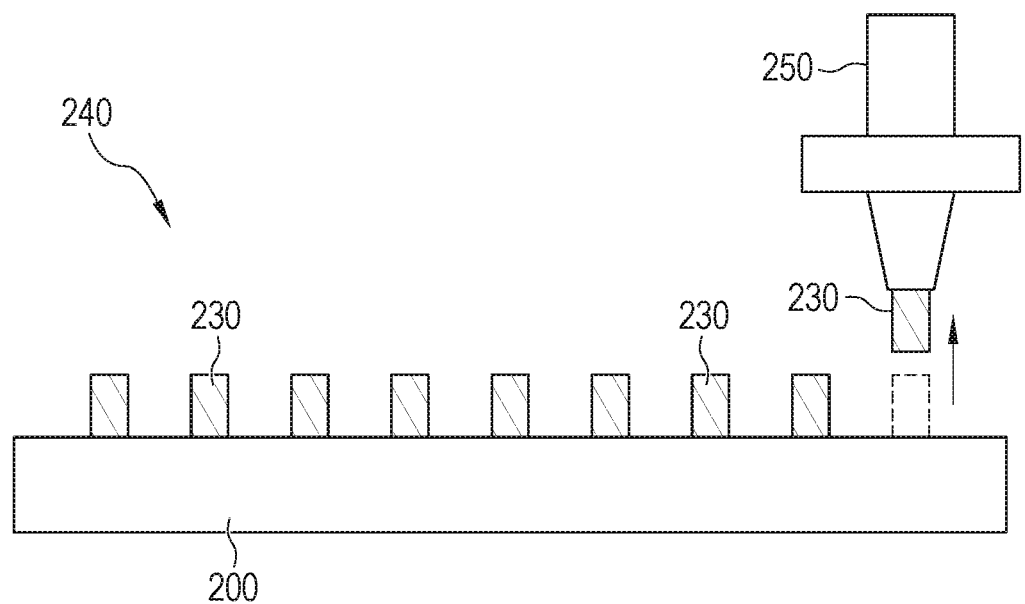

FIG. 4c shows a pick-and-place nozzle 250 grabbing a bar 230 off of a strip 240. Nozzle 250 is attached to a vacuum hose and pulls air through an opening in the bottom of the nozzle. When nozzle 250 approaches a bar 230, the bar is attached to the nozzle by the air pressure differential from ambient to within the nozzle. While nozzle 250 holds bar 230, the bar can be moved and rotated by the nozzle to place the bar as desired.

Figure 4D:
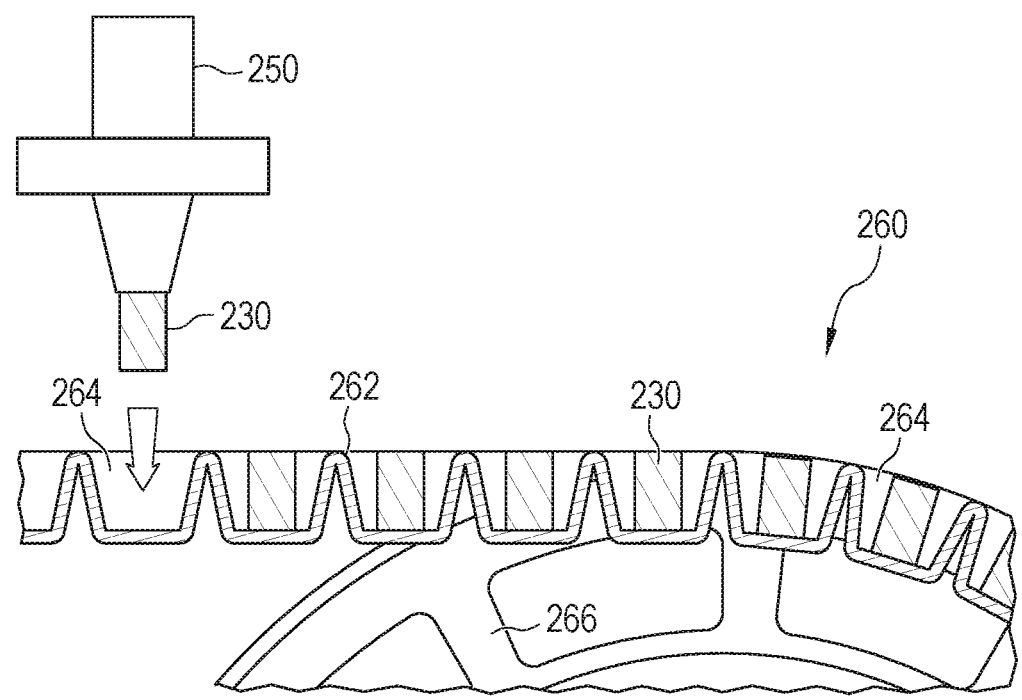

FIG. 4d shows nozzle 250 moved to place bar 230 into a tape-and-reel storage 260. Tape-and-reel storage 260 includes a carrier tape 262 with a plurality of pockets 264. Each pocket 264 is designed to hold a single bar 230. A cover tape is placed over carrier tape 262 to keep bars 230 in pockets 264 and then the carrier tape is wrapped up around a reel 266. The reel 266, once wrapped with tape 262 to the desired number of units, can be shipped to a customer for use in manufacturing semiconductor packages. Disposing bars 230 onto tape-and-reel storage 260 is optional. In other embodiments, the same manufacturer of semiconductor packages makes bars 230 and then disposes bars 230 directly from strips 240 to a semiconductor package being manufactured.

Figure 5A:
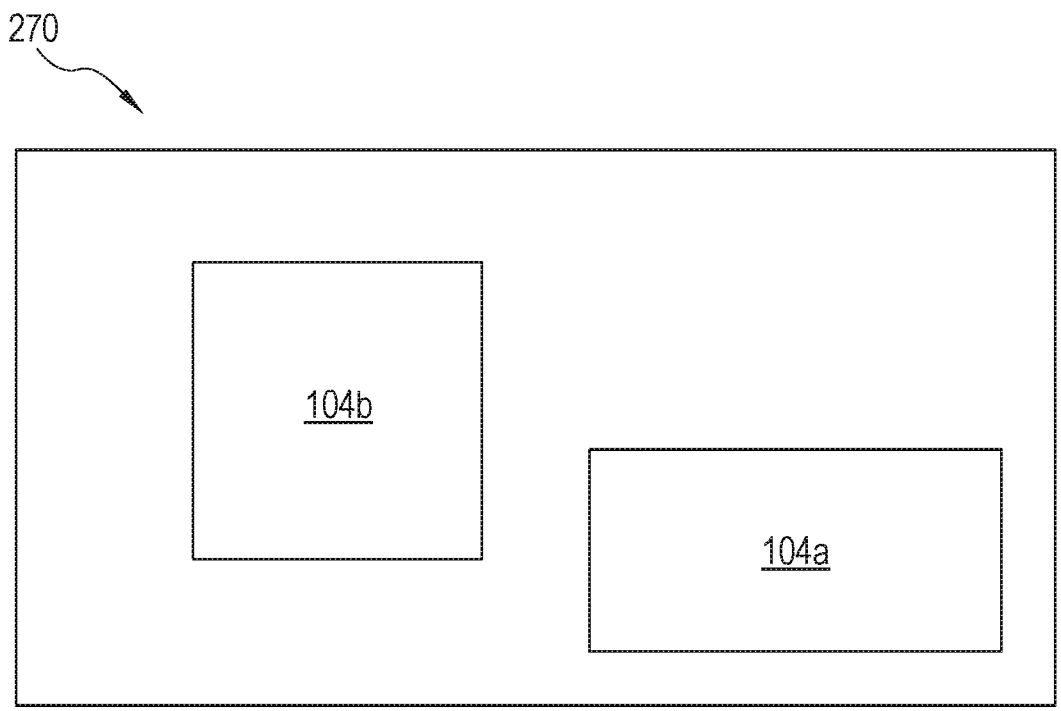
FIGS. 5a-5h illustrate using the metal bars to form compartment shielding.

FIGS. 5a-5h illustrate using bars 230 to form a compartment shield as part of a semiconductor package 270. FIG. 5a shows a plan view of package 270 with semiconductor die 104a and 104b mounted on substrate 272. Semiconductor die 104a and 104b are simply exemplary components to be shielded from each other. The components on substrate 272 may include discrete active and passive components or any other electrical components instead of or in addition to one of the semiconductor die 104. For instance, semiconductor die 104a may need to be shielded from an RF filter formed from surface mount passive components.

Figure 5B:
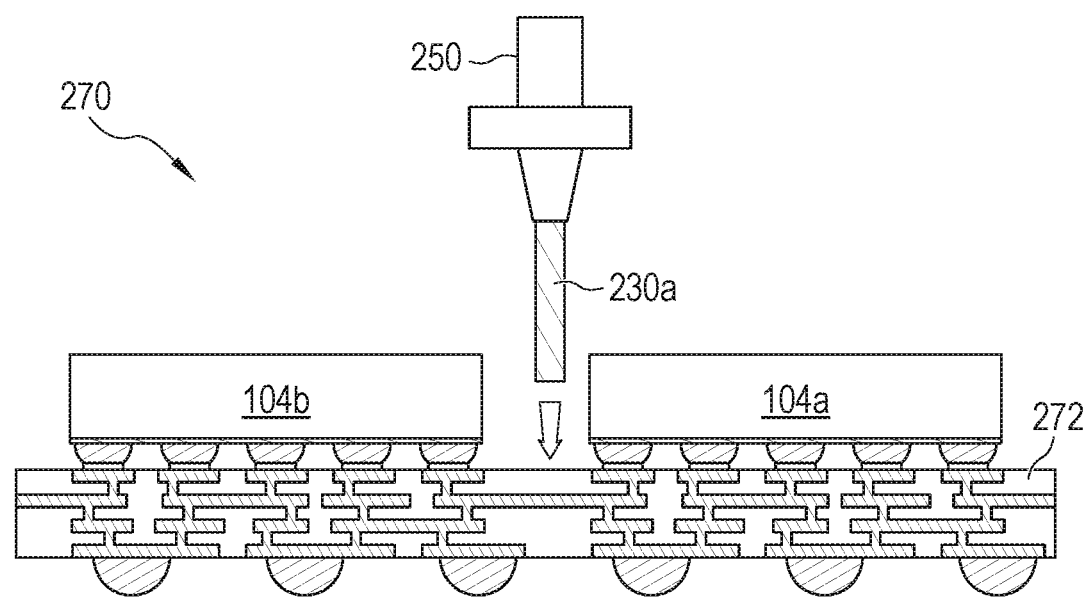
Figure 5C:
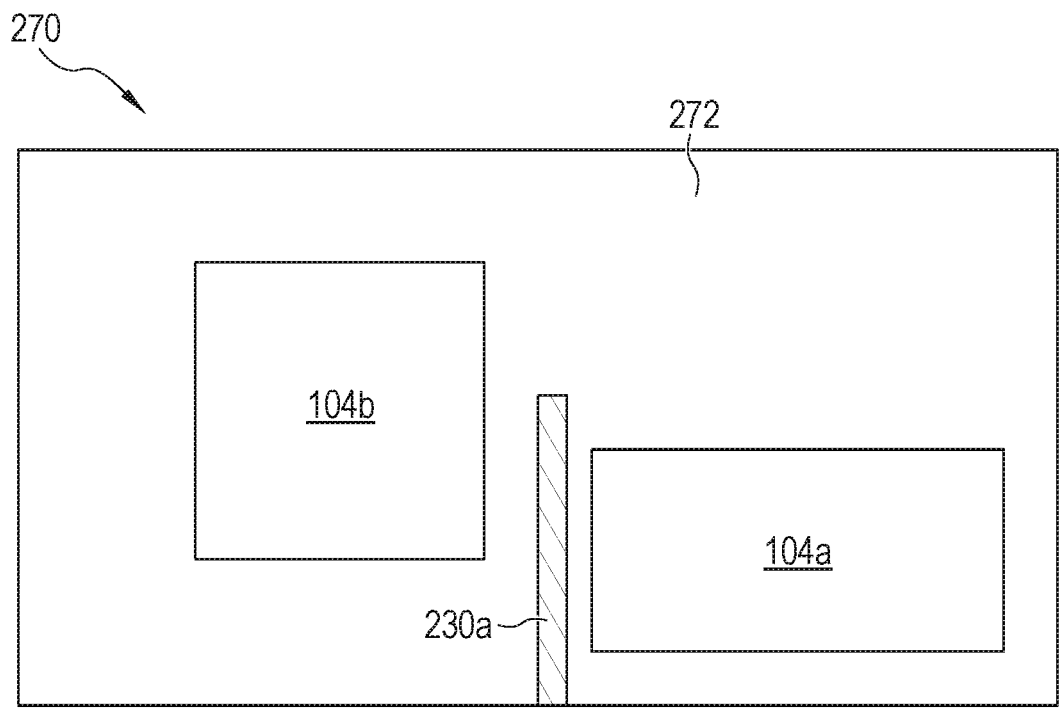

FIG. 5b shows a cross-sectional view of a bar 230a being disposed over substrate 272 between semiconductor die 104a and 104b. Nozzle 250 can be the same or a different nozzle as shown in FIG. 4c. Nozzle 250 is used to pick up individual bars 230 from strip 240 or tape-and-reel storage 260 and move them into the desired place over package substrate 272. Nozzle 250 can be programmed to dip bars 230 into a solder paste prior to placement of the bars onto substrate 272. Alternatively, solder paste can be printed onto substrate 272 prior to placement of bars 230. The solder paste is later reflowed to mechanically attach bars 230 to substrate 272. Other attachment mechanisms are used between bars 230 and substrate 272 in other embodiments. FIG. 5c shows bar 230a placed in plan view.

Figure 5D:
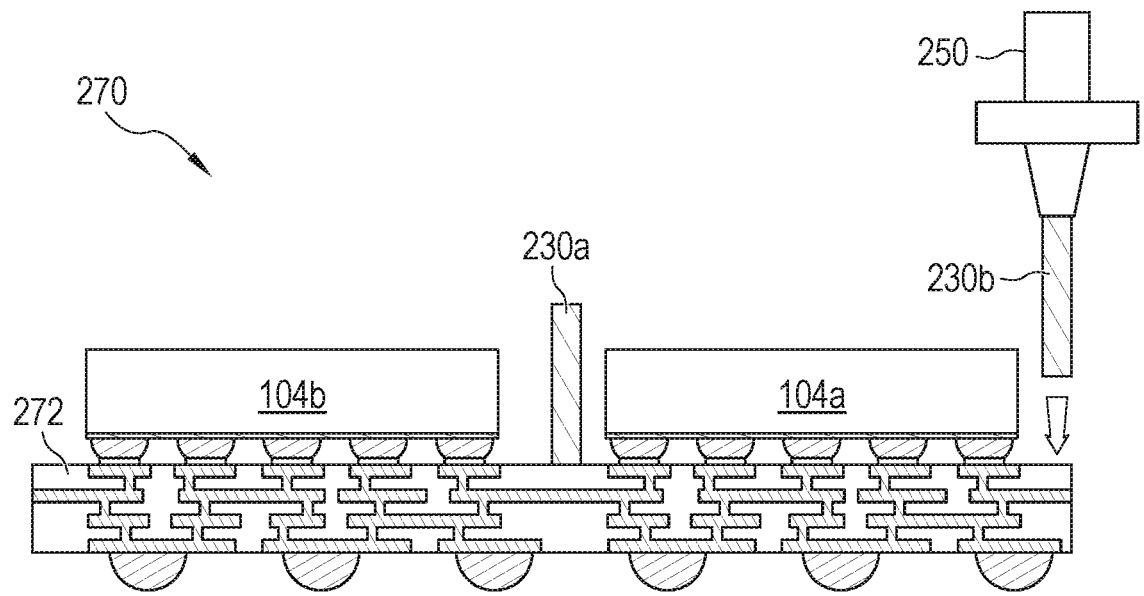
Figure 5E:
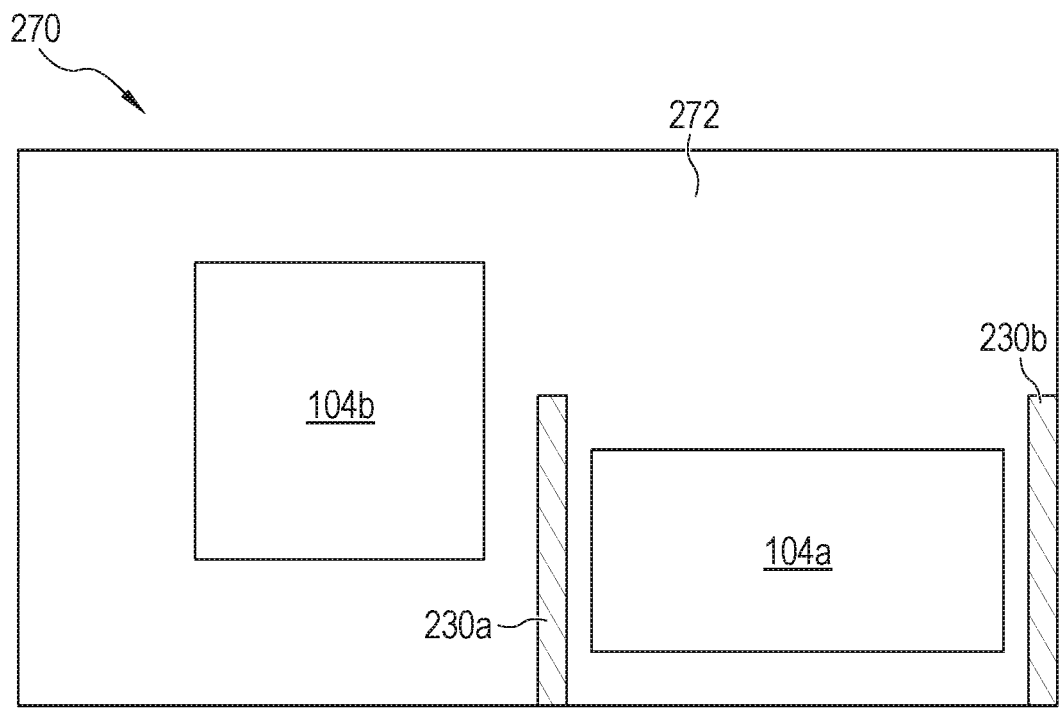
Figure 5F:
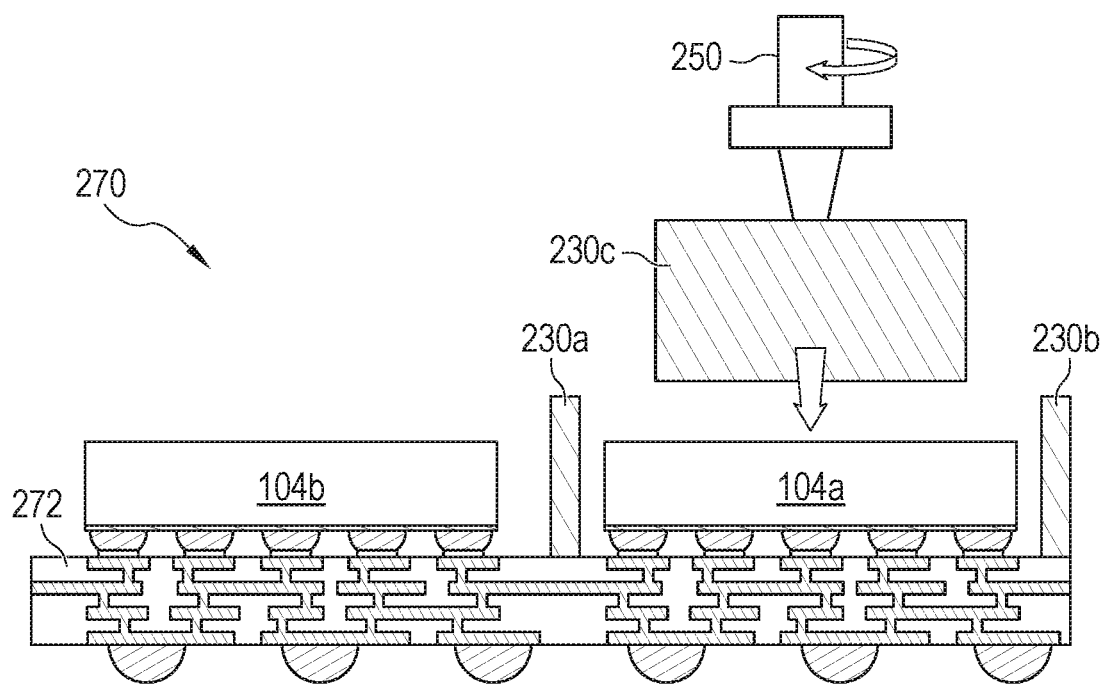

In FIG. 5d, a second bar 230b is picked up using nozzle 250 and placed on the opposite side of semiconductor die 104a from bar 230a. FIG. 5e shows bars 230a and 230b placed in plan view. FIG. 5f shows a third bar 230c being placed. Nozzle 250 can be rotated in addition to moving in the x, y, and z directions. FIG. 5f shows nozzle 250 having been used to turn bar 230c 90 degrees. Bar 230c is placed between bars 230a and 230b on a perpendicular side of semiconductor die 104a.

Figure 5G:
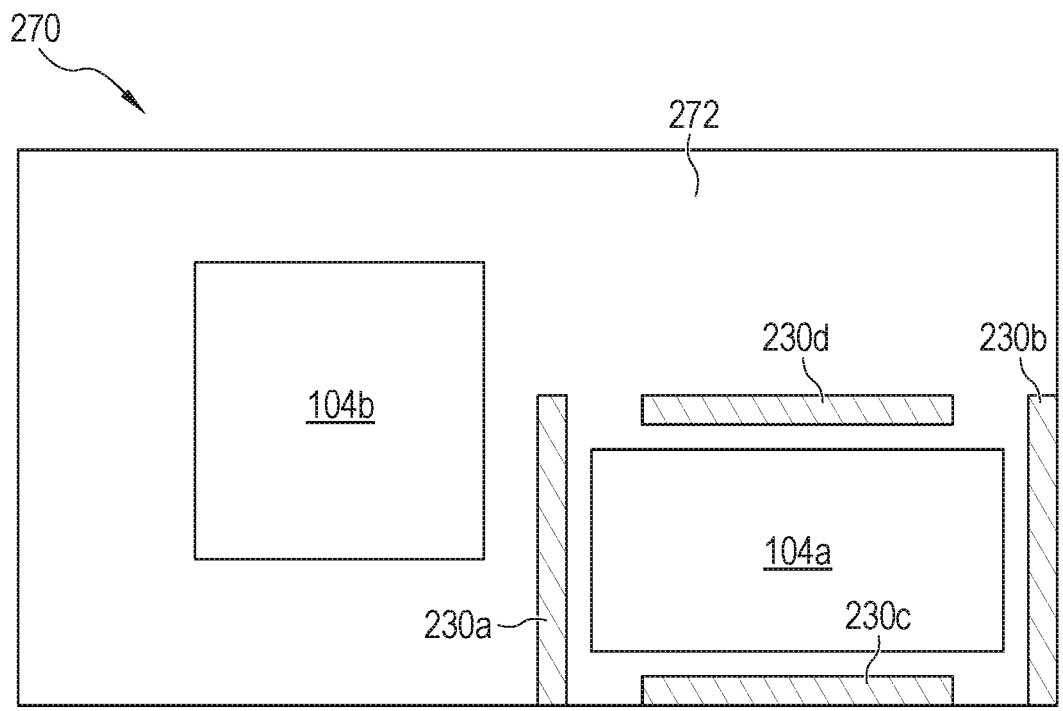

FIG. 5g shows a plan view with four bars 230a-230d placed to surround semiconductor die 104a on all four sides. Bars 230a-230d are placed in any suitable order. In one embodiment, bars 230 are placed in a clockwise or counterclockwise fashion, e.g., in the order of bar 230d, 230b, 230c, and finally 230a, instead of placing bars on opposite sides from each other first.

Figure 5H:
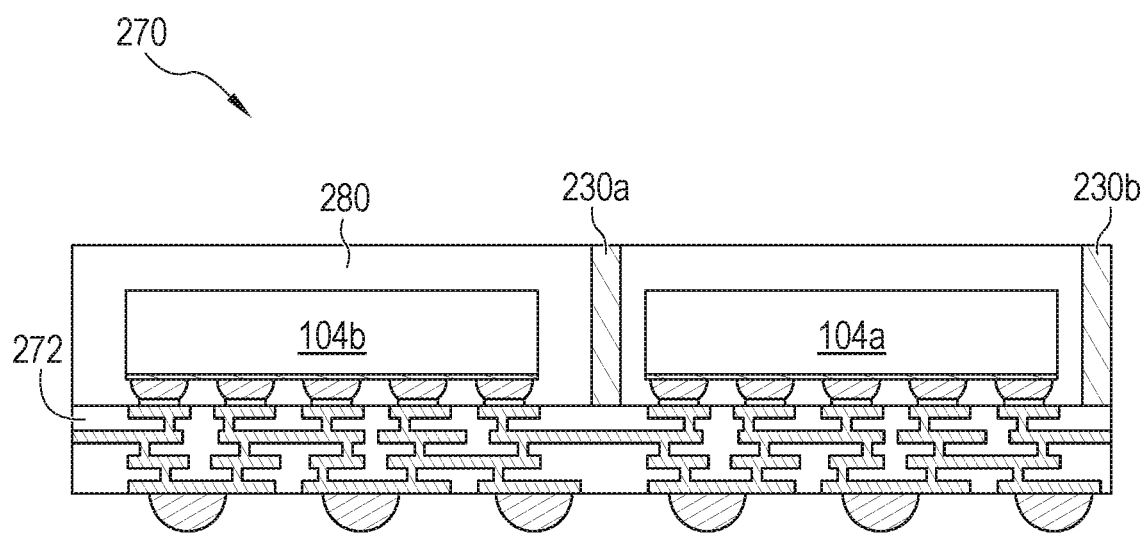

An encapsulant 280 is deposited over package 270 in FIG. 5h. Encapsulant 280 is optionally backgrinded to expose bars 230 if desired. In some embodiments, packages 270 are formed as a panel and then singulated into the individual units shown in FIG. 5h after encapsulant 280 is deposited. A shielding layer can be formed over encapsulant 280. The shielding layer could be sputtered over package 270 to contact the top surfaces of bars 230 and optionally extend down the sides of the package to contact the sides of substrate 272 including conductive layers formed within the substrate.

Bars 230a-230d surround semiconductor die 104a and have a similar effect as the can used in the prior art. However, bars 230 are much easier to use and allow for a flexible layout that can be changed without having to manufacture different bars. Forming metal bars 230 by sputtering or spraying metal into mask openings 210 enables formation of bars 230 under 200 μm, which was not feasible in the prior art. Bars 230 are placed using traditional pick-and-place equipment, e.g., the same nozzle 250 that is also used to place semiconductor die 104 and other discrete electrical components onto substrate 272, and therefore can be used in cheaper and simpler manufacturing lines.

Figure 6A:
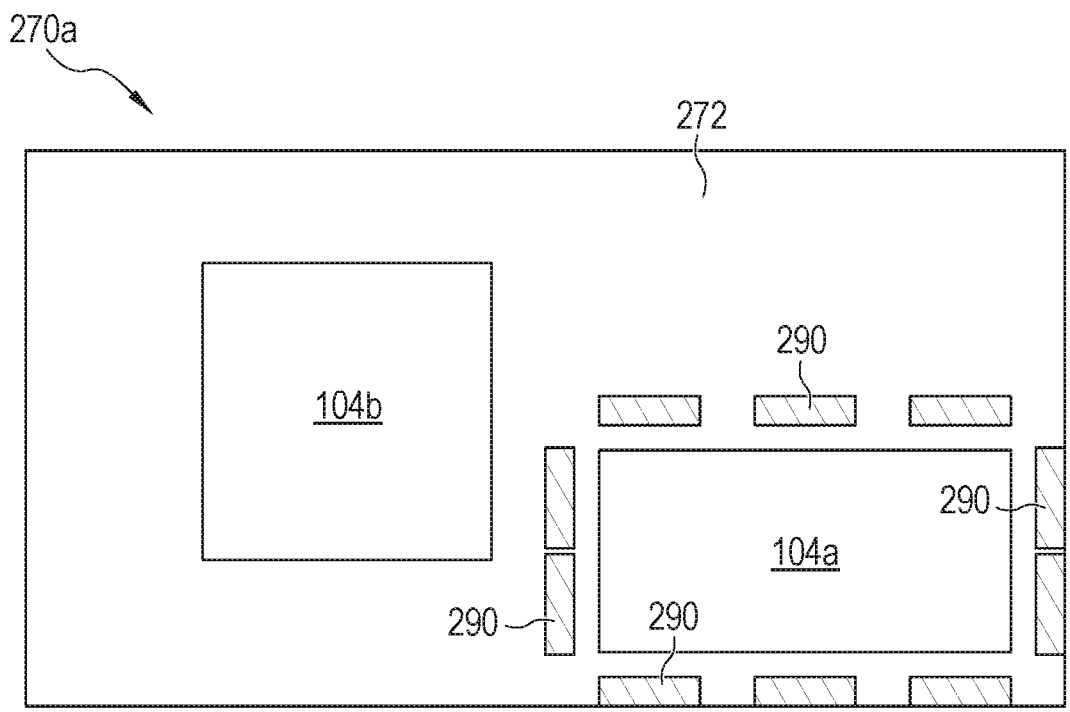
FIGS. 6a and 6b illustrate other embodiments.
Figure 6B:
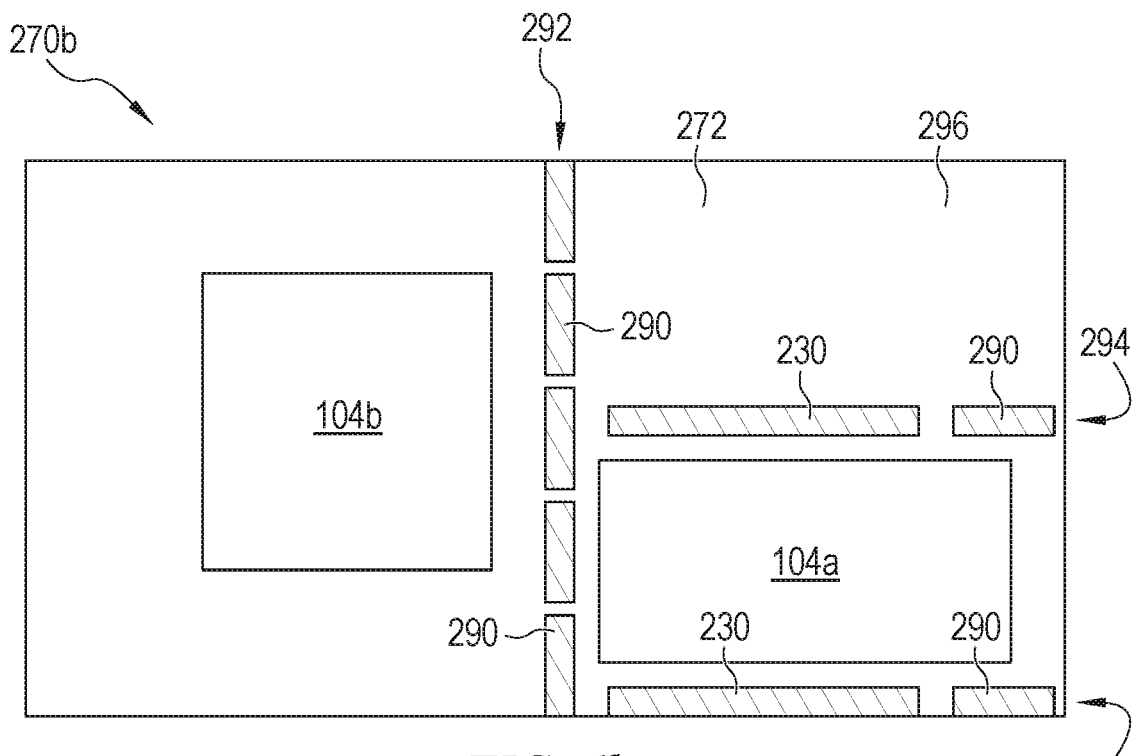

FIGS. 6a and 6b illustrate alternative metal bar embodiments. FIG. 6a shows a package 270a formed with smaller bars 290. Bars 290 have the same thickness and height as bars 230 but have a shorter length. The shorter length of bars 290 allows a single length of bar to be used in a wider variety of situations and to make more varied wall shapes. For instance, having three bars 290 on the top and bottom sides of semiconductor die 104a in FIG. 6a allow the length of the bars to correspond more closely to the length of the semiconductor die than the single bar 230 did. Using bars 290 with a shorter length will allow the compartmentalized path to conform to tighter turns or curves.

In FIG. 6b, shorter bars 290 are used in combination with longer bars 230 to form semiconductor package 270b. Any suitable combination of bars 230 and bars 290 can be used to create a wide variety of compartments within package 270. Metal bars can be formed in any suitable length, width, and height as needed for a particular package or for the desired flexibility in shield shapes. In FIG. 6b, shorter bars 290 are used to form a compartment wall 292 between semiconductor die 104a and 104b splitting package 270 into two areas. Walls 294 extend from wall 292 along the sides of semiconductor die 104a. Two longer bars 230 wouldn't fit between wall 292 and the side of package 270, so utilizing shorter bars 290 in combination with the longer bars 230 provides a more complete shielding. A compartment 296 is completely separated from both semiconductor die 104a and 104b by walls 292 and 294, and may include additional active or passive components mounted onto substrate 272.

Figure 7A:
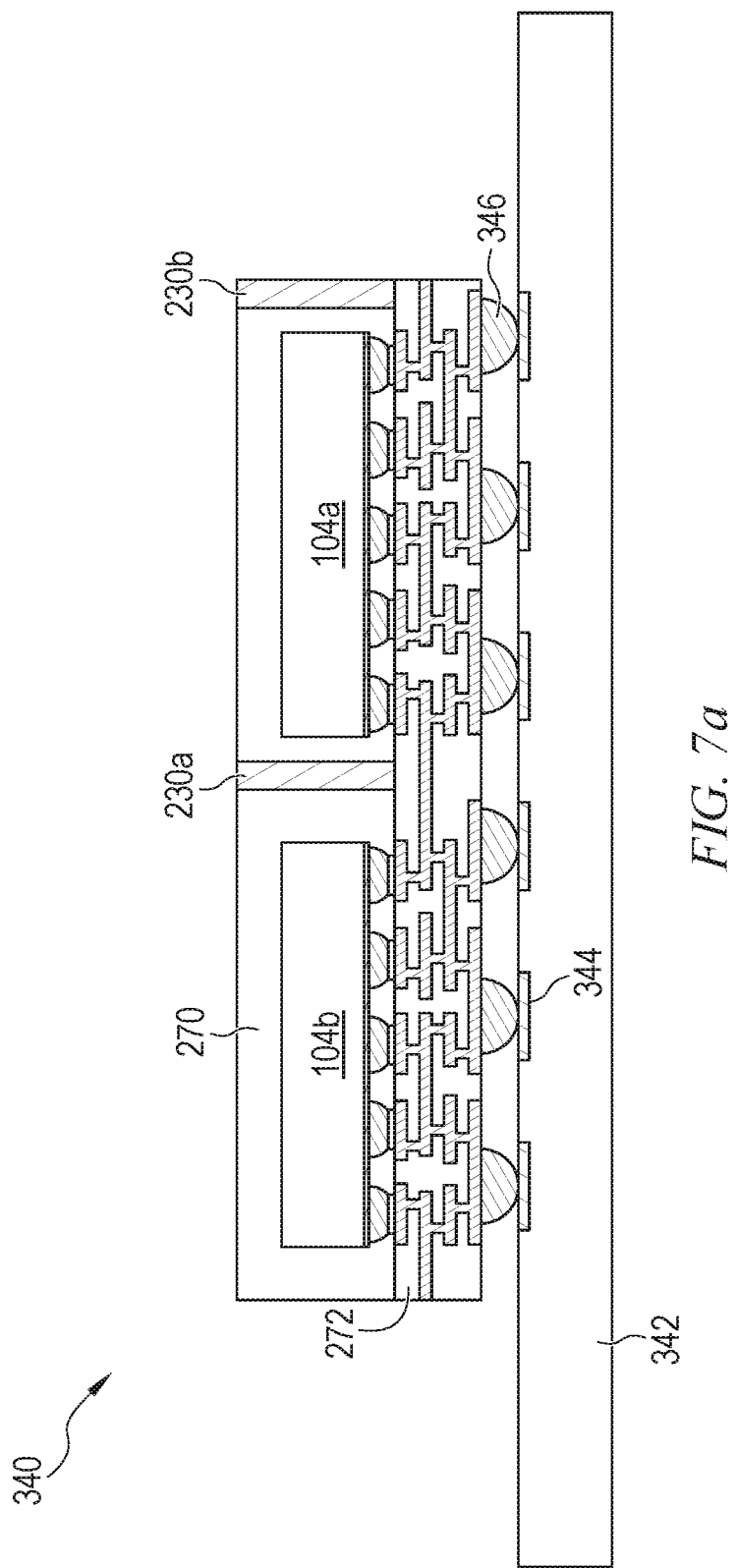
FIGS. 7a and 7b illustrate integrating the shielded semiconductor packages into an electronic device.
Figure 7B:
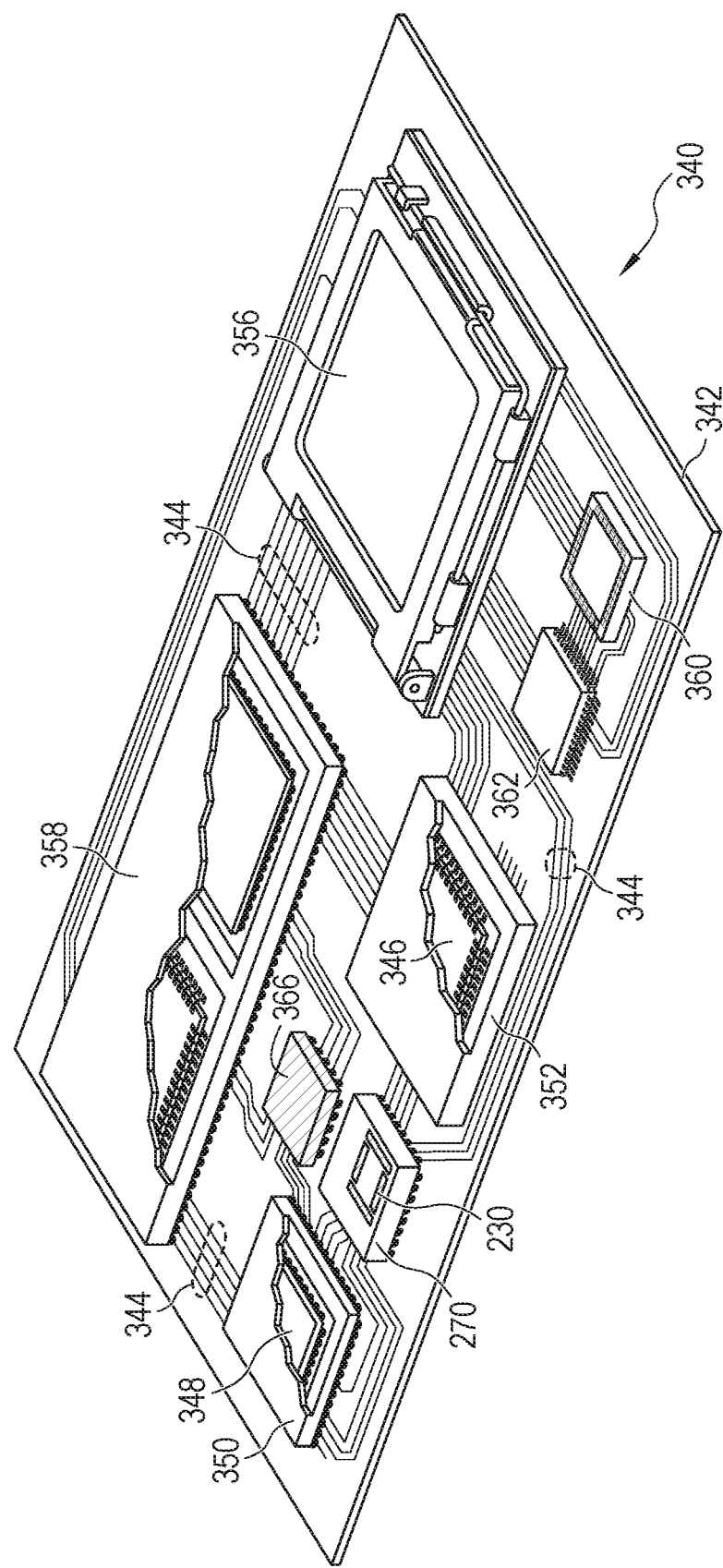

FIGS. 7a and 7b illustrate incorporating the above-described semiconductor packages, e.g., package 270, into an electronic device 340. FIG. 7a illustrates a partial cross-section of package 270 mounted onto a printed circuit board (PCB) or other substrate 342 as part of electronic device 340. Bumps 346 are formed on the bottom of substrate 262 during manufacturing, in a similar process to bumps 112 being formed on die 104, and then reflowed onto conductive layer 344 of PCB 342 to physically attach and electrically connect package 270 to the PCB. In other embodiments, thermocompression or other suitable attachment and connection methods are used. In some embodiments, an adhesive or underfill layer is used between package 270 and PCB 342. Semiconductor die 104 are electrically coupled to conductive layer 344 through substrate 262.

FIG. 7b illustrates electronic device 340 including PCB 342 with a plurality of semiconductor packages mounted on a surface of the PCB, including package 270. Electronic device 340 can have one type of semiconductor package, or multiple types of semiconductor packages, depending on the application. Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 366 are shown mounted on PCB 342 along with package 270. Conductive traces 344 electrically couple the various packages and components disposed on PCB 342 to package 270, giving use of the components within package 270 to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
    providing a substrate;
    disposing a first electrical component over a surface of the substrate;
    disposing a second electrical component over the surface of the substrate;
    forming a first metal bar by,
        providing a carrier,
        disposing a mask over the carrier,
        forming an opening in the mask,
        sputtering a metal layer over the mask, and
        removing the mask to leave the first metal bar on the carrier; and
    disposing the first metal bar over the surface of the substrate between the first electrical component and the second electrical component, wherein the first metal bar includes a length greater than a width of the first metal bar, and wherein the length of the first metal bar and the width of the first metal bar are both oriented perpendicular to the surface of the substrate.

2. The method of claim 1, further including using a pick and place process or device to move the first metal bar from the carrier to a tape-and-reel storage.

3. The method of claim 1, further including disposing a second metal bar over the substrate with the first electrical component between the first metal bar and the second metal bar.

4. The method of claim 3, further including disposing a third metal bar and a fourth metal bar over the substrate with the first electrical component between the third metal bar and the fourth metal bar.

5. The method of claim 1, further including disposing a second metal bar over the substrate, wherein a length of the second metal bar is different from a length of the first metal bar.

6. A method of making a semiconductor device, comprising:
    providing an electrical component;
    removing a first metal bar from a tape-and-reel storage; and disposing the first metal bar adjacent to the electrical component after removing the first metal bar from the tape-and-reel storage, wherein the first metal bar includes a length greater than a width of the first metal bar, and wherein the length of the first metal bar and the width of the first metal bar are both oriented perpendicular to the surface of the substrate.

7. The method of claim 6, further including disposing a second metal bar adjacent to the electrical component.

8. The method of claim 7, further including disposing a third metal bar and fourth metal bar adjacent to the electrical component, wherein the first metal bar, the second metal bar, the third metal bar, and the fourth metal bar in combination substantially surround the electrical component.

9. The method of claim 6, further including forming the first metal bar by:
forming an opening in a mask; and
sputtering a metal material into the opening.

10. The method of claim 6, further including disposing the first metal bar using a pick-and-place nozzle.

11. A semiconductor device, comprising:
a substrate;
a first electrical component disposed on a first surface of the substrate;
a second electrical component disposed on the first surface of the substrate; and
a plurality of first metal bars disposed lined up on the first surface of the substrate between the first electrical component and the second electrical component;
wherein each of the plurality of first metal bars includes a length parallel to a first side of the first electrical component and also parallel to the surface of the substrate;
wherein the first side of the first electrical component is linear along an axis in plan view;
wherein each of the plurality of first metal bars overlaps the first electrical component along the axis;
wherein each of the plurality of first metal bars includes a width that is perpendicular to the length and parallel to the surface of the substrate; and
wherein the length of each of the plurality of first metal bars is greater than a width of a respective one of the plurality of first metal bars.

12. The semiconductor device of claim 11, further including a second metal bar disposed over the substrate adjacent to the first electrical component and oriented perpendicular to the plurality of first metal bars.

13. The semiconductor device of claim 12, wherein the second metal bar has a second length different from the length of each of the plurality of first metal bars.

14. The semiconductor device of claim 12, wherein the second metal bar has a second length approximately the same as the length of each of the plurality of first metal bars.

15. The semiconductor device of claim 12, further including a third metal bar and a fourth metal bar disposed over the substrate, wherein the plurality of first metal bars, the second metal bar, the third metal bar, and the fourth metal bar are all disposed along a different side of the first electrical component.

16. The semiconductor device of claim 11, further including an encapsulant deposited over the substrate, the first electrical component, the second electrical component, and the plurality of first metal bars.

17. A semiconductor device, comprising:
a substrate;
a first electrical component disposed over a surface of the substrate;
a second electrical component disposed over the surface of the substrate; and
a plurality of first metal bars disposed over the surface of the substrate between the first electrical component and the second electrical component, wherein each individual metal bar of the plurality of first metal bars includes a length greater than a width of the each individual metal bar, and wherein the length and the width of the each individual metal bar of the plurality of first metal bars are both oriented perpendicular to the surface of the substrate.

18. The semiconductor device of claim 17, further including a second metal bar disposed over the substrate adjacent to the first electrical component.

19. The semiconductor device of claim 18, wherein a length of the second metal bar is different from the length of each individual metal bar of the plurality of first metal bars.

20. The semiconductor device of claim 18, wherein a length of the second metal bar is the same as the length of each individual metal bar of the plurality of first metal bars.

21. The semiconductor device of claim 18, further including a third metal bar and a fourth metal bar disposed over the substrate, wherein the plurality of first metal bars, the second metal bar, the third metal bar, and the fourth metal bar in combination substantially surround the first electrical component.

22. The semiconductor device of claim 17, further including an encapsulant deposited over the substrate, the first electrical component, the second electrical component, and the plurality of first metal bars.

* * * * *